US006236237B1

(12) United States Patent
Wong et al.

(10) Patent No.: US 6,236,237 B1
(45) Date of Patent: May 22, 2001

(54) OUTPUT BUFFER PREDRIVER WITH EDGE COMPENSATION

(75) Inventors: Myron W. Wong; Mark Chan, both of San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/258,165

(22) Filed: Feb. 25, 1999

Related U.S. Application Data

(60) Provisional application No. 60/076,304, filed on Feb. 27, 1998.

(51) Int. Cl.[7] ........................ H03K 19/01; H03K 19/0175

(52) U.S. Cl. .................................. 326/83; 326/83; 326/17; 326/87; 326/20

(58) Field of Search ................................ 326/83, 87, 17, 326/20, 112, 113, 119, 121

(56) References Cited

U.S. PATENT DOCUMENTS

| | | | | |
|---|---|---|---|---|
| 5,239,211 | * | 8/1993 | Jinbo | 307/443 |
| 5,414,375 | * | 5/1995 | Tsuboi | 326/30 |
| 5,583,460 | * | 12/1996 | Dohi et al. | 327/126 |
| 5,633,600 | * | 5/1997 | Ohnishi | 326/17 |
| 5,654,652 | * | 8/1997 | Raza et al. | 327/17 |
| 5,717,342 | * | 2/1998 | Lotfi et al. | 326/17 |
| 5,831,447 | * | 11/1998 | Chaw | 326/27 |

* cited by examiner

Primary Examiner—Michael Tokar
Assistant Examiner—Vibol Tam
(74) Attorney, Agent, or Firm—Townsend and Townsend and Crew LLP

(57) ABSTRACT

An output buffer with feedback to a predriver circuit such that the effective size of the predriver buffers are momentarily adjusted to favor a particular transition (i.e., low-to-high or high-to-low). The delayed output selectively alters the input threshold characteristic of the predriver circuit to favor the appropriate transition. Thus, the time during which the output drivers are subject to a crowbar current is reduced over previous devices.

29 Claims, 4 Drawing Sheets

OUTPUT BUFFER PREDRIVER WITH EDGE COMPENSATION

CROSS-REFERENCES TO RELATED APPLICATIONS

This application claims the benefit of Provisional Application No. 60/076,304 filed Feb. 27, 1998 entitled Output Buffer which is incorporated herein by reference for all purposes.

BACKGROUND OF THE INVENTION

The present invention relates generally to semiconductor devices, and more particularly to output buffers for semiconductor devices.

An important aspect of semiconductor devices is the switching speed of the output drivers. The switching speed of the output drivers are a major factor in the rate at which data can be transferred out of the device, and thus its operating frequency. Programmable logic devices are one type of semiconductor device that use output buffers, although most—if not all—semiconductor devices use output buffers, also.

An output predriver may be designed to adjust the pull-up and pull-down speed of the output buffer thereby altering the switching speed of the output driver. FIG. 1 illustrates a typical output buffer 100 with an output predriver such as may be included in currently available semiconductor devices. Output buffer 100 has a pull-up predriver 110, a pull-down predriver 120 and an output driver 130. Output driver 130 is further comprised of a pull-up transistor 134 and a pull-down transistor 138.

Both output predrivers 110 and 120 comprise a series of inverting buffers 142–146. The inverting buffers of pull-up predriver 110 may be appropriately sized to favorably adjust the switching speed for the low-to-high transition of pull-up driver 134. Similarly, the inverting buffers of pull-down predriver 120 may be sized to favorably adjust the switching speed for the high-to-low transition of pull-down transistor 138.

A disadvantage associated with output buffer 100 is that when the inverting buffers are sized to favor both switching from high-to-low and from low-to high in terms of speed, the design may cause a "crowbar current." A crowbar current is a short circuit current caused by both the pull-up driver and the pull-down drivers being on concurrently. This occurs because when the predrivers are advantageously sized to turn on the pull-up or pull-down drivers as fast as possible, the drivers are more difficult to turn off quickly. Thus, when either driver is turning on, there is a period of time when the opposing driver is still on due to predriver's inability to switch the opposing driver into the off state. This causes a crowbar current. The crowbar current is effectively analogous to a short circuit from power to ground through the concurrently "on" output transistors. Some detrimental effects of such a crowbar current include increased power bus noise, increased power consumption for active devices and, in some cases, non-optimal output switching speed.

SUMMARY OF THE INVENTION

The present invention greatly reduces the crowbar current of output buffers. It provides an output buffer with delayed feedback to a predriver circuit such that the effective size of the predriver buffers are momentarily adjusted to favor a particular transition (i.e., low-to-high or high-to-low). The delayed output is used to selectively alter the input threshold characteristic of the predriver circuit to favor the appropriate transition. Thus, the time during which the output drivers are subject to a crowbar current is greatly reduced over previously available devices.

According to one embodiment of the present invention, the output buffer comprises a pull-up and pull-down driver, the output node of the output buffer being the common node between the two drivers. A first predriver circuit is coupled to the pull-up driver and a second predriver circuit is coupled to the pull-down driver. Each predriver circuit includes an inverting buffer with a pull-up and pull-down transistor coupled to its output. A delay circuit provides a delayed output signal from the output node of the output buffer. The delayed output signal controls a pass transistor or other switching device to selectively couple a signal from the input of the output buffer to the pull-up or pull-down transistors. Effectively, this causes the input threshold characteristics of the predriver circuit to vary during the delay period, causing the output drivers to switch more quickly. In another embodiment of the present invention, the predriver circuit is replicated for multiple stages of buffers to increase the switching speed even more.

A further understanding of the nature and advantages of the inventions presented herein may be realized by reference to the remaining portions of the specification and the attached claims.

DESCRIPTION OF THE SPECIFIC EMBODIMENTS

Figure 1:
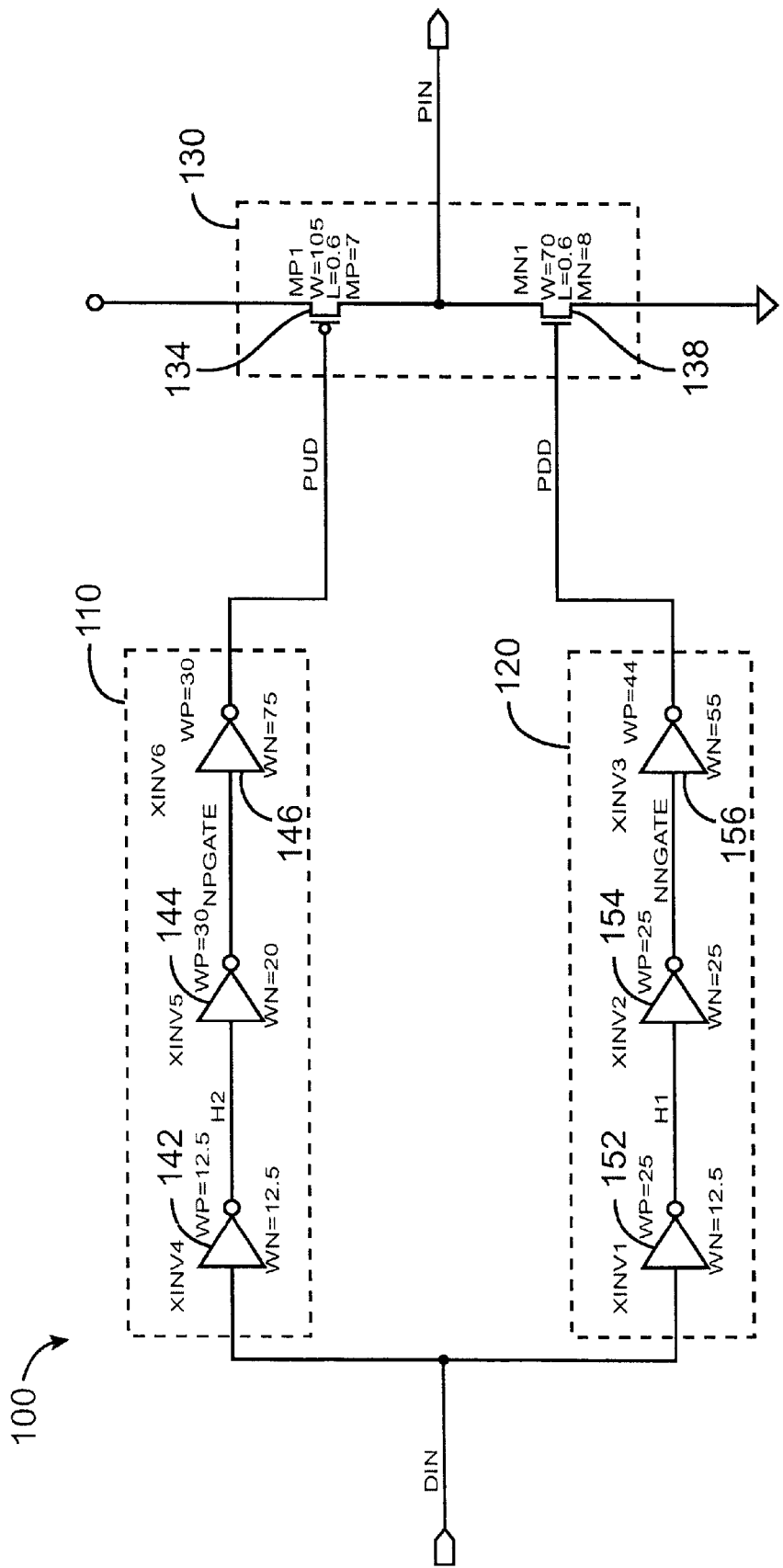
FIG. 1 shows a prior art output buffer circuit schematic.
Figure 2:
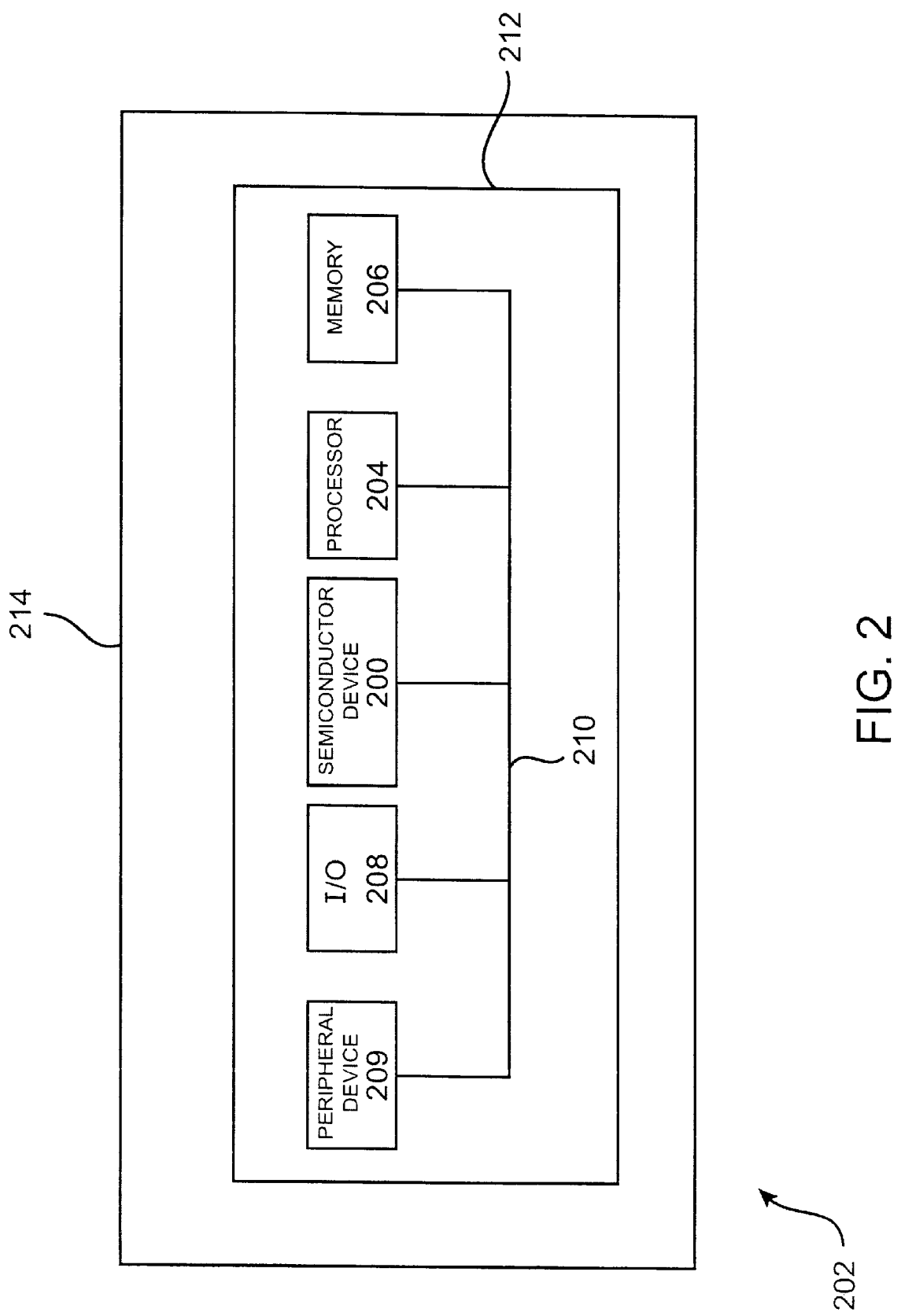
FIG. 2 is a block diagram of a digital system in which the present invention may be incorporated.

FIG. 2 illustrates a semiconductor device 200 that includes an output buffer according to the present invention. Semiconductor device 200 may be, for example, a programmable logic device, though it is not limited to only programmable logic devices. One or more semiconductor devices 200 may be embodied in a digital system 202. Digital system 202 may include one or more of the following components: a processor 204; memory 206; I/O circuitry 208; and peripheral devices 209. Any or all of these components may include the output buffer of the present invention. These components are coupled together by a system bus 210 and are populated on a circuit board 212 which is contained in an end-user system 214.

Digital system 202 may be used in a wide variety of applications, such as computer networking, data networking, instrumentation, video processing, digital signal processing, or any other applications. Semiconductor device 200 can provide a variety of different logic functions. For example, semiconductor device 200 can be a programmable logic device configured as a processor or controller that works in cooperation with processor 204. It may also be used as an arbiter for arbitrating access to a shared resource in digital system 202. In yet another example, semiconductor device 200 may be configured as an interface between processor 204 and one of the other components in digital system 202. It should be noted that digital system 202 is only exemplary, and the true scope and spirit of the present invention is indicated by the following claims.

Figure 3:
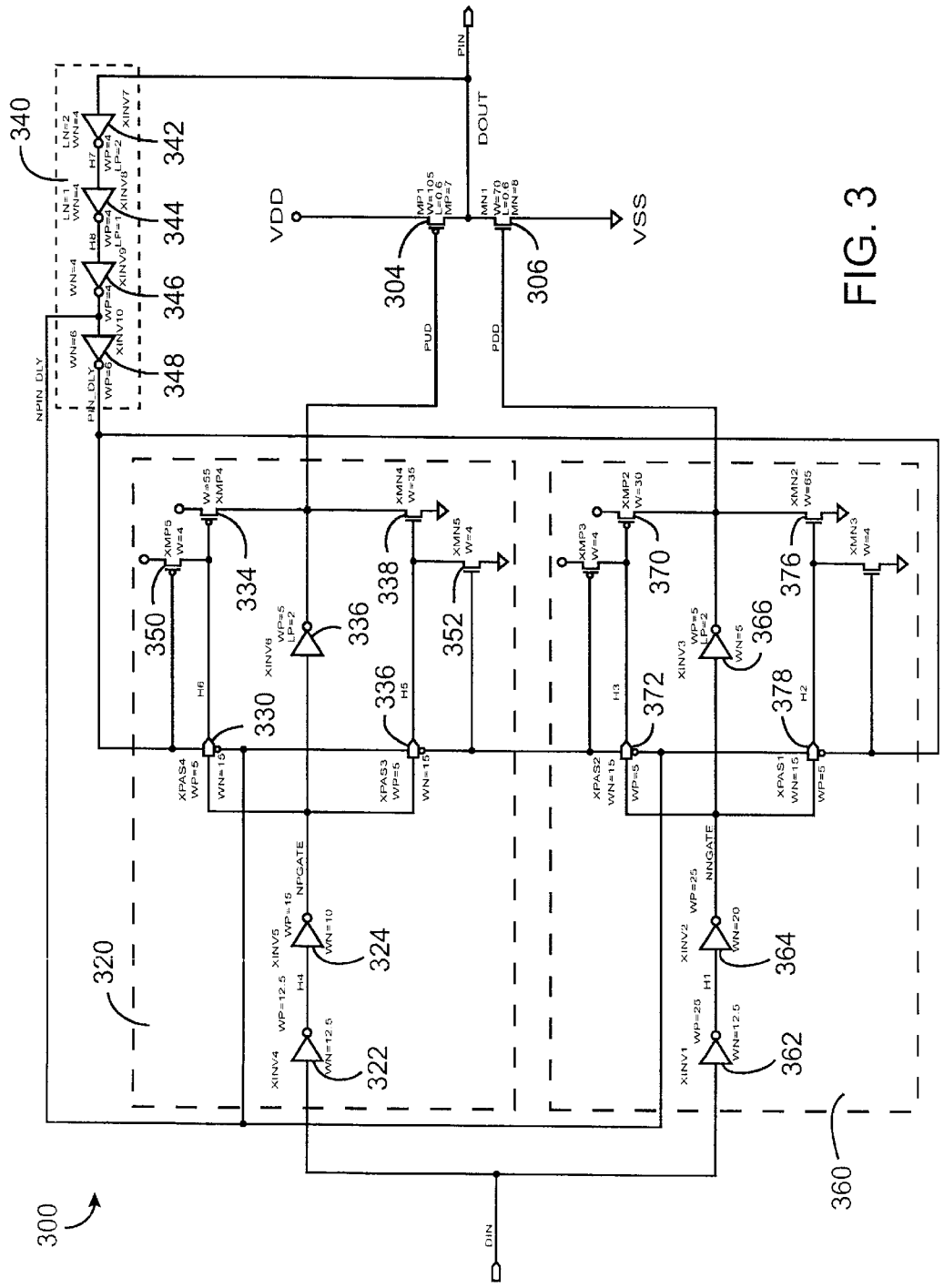
FIG. 3 shows a circuit diagram of a first specific circuit embodiment of an output buffer according to the present invention.

FIG. 3 shows a specific embodiment of an output buffer 300 according to the present invention. Output buffer 300 includes an input DIN and an output DOUT. Input DIN is typically coupled to other circuitry and logic, while output DOUT is typically coupled to an I/O pin of a semiconductor device incorporating output buffer 300. The benefits of output buffer 300 over currently available output buffers include a greatly reduced crowbar current, reduced power-rail noise, output AC switching current, and improved switching speed.

Output buffer 300 includes an output driver with a pull-up transistor 304 and a pull-down transistor 306 coupled in series between VDD and VSS, or other similar reference voltages. Output DOUT is coupled to the common node between pull-up transistor 304 and pull-down transistor 306 such that when pull-up transistor 304 is on, DOUT is driven high, and when pull-down transistor 306 is on, DOUT is driven low. It is typically undesirable that both pull-up transistor 304 and pull-down transistor 306 are turned on simultaneously. In the specific embodiment shown in FIG. 3, pull-up transistor 304 is a p-type transistor and pull-down transistor 306 is an n-type transistor, although in other embodiments other types of transistors may be used. Each are activated by inverting predriver circuitry such that in the steady state, when input DIN is a logical zero, pull-up transistor 304 is off and pull-down transistor 306 is on, thus driving DOUT low. Similarly, in the steady state, when input DIN is high, pull-down transistor 306 is off and pull-up transistor 304 is on, thereby driving output DOUT high. In other embodiments, the predriver circuitry may be non-inverting with appropriate changes to account for the difference in logic polarity The predriver circuitry includes a pull-up predriver 320. Pull-up predriver 320 comprises three inverting buffers 322–326 that are coupled in series between input DIN and the gate of pull-up transistor 304. In the specific embodiment, inverting buffer 326 (i.e., the third one) is a CMOS invertor. The specific embodiment of the CMOS invertor has a channel width of five for its pull-up p-transistor and a channel width of five for its pull-down n-transistor, but these sizes may be readily varied for different appications. The output of inverting buffer 324 (i.e., the middle one) is coupled though a pass transistor 330 to a pull-up transistor 334. Pull-up transistor 334 is coupled between VDD and the output of inverting buffer 326. Pull-up transistor 334 is a relatively large transistor. In the specific embodiment, the channel width of pull-up transistor 334 is 55, although other sizes may also be used. Thus, when pass transistor 330 is on, the driving capability of pull-up predriver 320 is effectively that of a transistor with a channel width of 60 (55 from pull-up transistor 334 and 5 from inverting buffer 326). Different channel widths may be used to vary the effective channel width. Conversely, when pass transistor 330 is off, the driving capability is effectively that of a transistor with a channel width of 5 (from inverting buffer 326.)

The output of inverting buffer 324 is similarly coupled through a pass transistor 336 to a pull-down transistor 338. Pull-down transistor 338 is coupled between the output of inverting buffer 326 and VSS. Pull-down transistor 338 is a large transistor with a channel width of 35 in the specific embodiment. Thus, when pass transistor 336 is on, the driving capability of pull-up predriver 320 is effectively that of a transistor with a channel width of 40 (35 from pull-down transistor 338 and 5 from inverting buffer 326.) When pass transistor 336 is off, the driving capability is effectively that of a transistor with a channel width of 5 (from inverting buffer 326.) Again, the specific embodiment defines specific sizes for the transistors, but other sizes may also be preferably used.

A delay circuit 340 is coupled to output DOUT and is fed back to the predriver circuitry. In the specific embodiment shown in FIG. 3, delay circuit 340 comprises a series of four inverting buffers 342–348. In other embodiments, more or fewer inverting buffers may be included in delay circuit 340. The output of delay circuit 340 and its complementary signal (from the output of inverting buffer 346) are coupled to the control gates of pass transistors 330 and 336. The signals are connected in opposite orientations such that in the steady state, when DOUT is at a logical zero, pass transistor 336 is on, and pass transistor 330 is off. Similarly, in the steady state, when DOUT is a logical one, pass transistor 336 is off and pass transistor 330 is on. Pass transistors 330 and 336 may be substituted with other switching devices.

Another pull-up transistor 350 is coupled between the gate of pull-up transistor 334 and VDD. The gate of pull-up transistor 350 is coupled to the output of delay circuit 340 such that when pass-transistor 350 is off, pull-up transistor 334 is held off, also. Similarly, a pull-down transistor 352 is coupled between the gate of pull-down transistor 338 and VSS. The gate of pull-down transistor 352 is coupled to the output of delay circuit 340 such that when pass transistor 336 is off, pull-down transistor 338 is also off.

The predriver circuitry also includes a pull-down predriver 360. Pull-down predriver is coupled to the gate of pull-down driver 306. It may be substantially similar to pull-up predriver 320, although in the specific embodiment shown in FIG. 3 some of the transistor sizes are different to provide for maximal efficiency. In general, the transistor sizes of all of the pull-up and pull-down transistors may be adjusted to provide the desired trip point.

Pull-down predriver 360 comprises three inverting buffers 362–366. In the specific embodiment, inverting buffer 362 has a p-transistor channel width of 25, and an n-transistor channel width of 12.5; inverting buffer 364 has a p-transistor channel width of 25, and an n-transistor channel width of 20. Inverting buffer 366 has a p-transistor channel width of 5, and an n-transistor channel width of 5. A pull-up transistor 370 is coupled between the output of inverting buffer 366 and VDD. Pull-up transistor 370 is controlled by the output of inverting buffer 388 through a pass transistor 372. A pull-down transistor 376 is coupled between the output of inverting buffer 366 and VSS. Pull-down transistor 376 is controlled by the output of inverting buffer 366 through a pass transistor 378. In the specific embodiment, pull-up transistor 370 has a channel width of 30 and pull-down transistor 376 has a channel width of 65, although other sizes may also be used.

In its operation, the predriver circuitry operates to adjust the input threshold characteristic (also known as the trip point) for pull-up predriver 320 and pull-down predriver 360. For the pull-down predriver, it is desirable for the trip point to be high when output DOUT is high and for the trip point to be low when output DOUT is low. This will allow for pull-down transistor 306 to turn on as fast as possible when pulling DOUT low, and to turn off as fast as possible when pull-up transistor 304 is driving DOUT high. This reduces crowbar current, lessens power rail noise, and increases switching speed since there much reduced opposing driver contention over currently available devices.

The present invention operates in the specific embodiment shown in FIG. 3 to adjust the trip point as follows. When input DIN is low, then output DOUT is also low (in the steady state). In this state, pass transistors 330 and 372 are off, while pass transistors 336 and 378 are on. When input DIN transitions from low to high, then inverting buffers 324 and 364 drive pull-up transistor 304 and pull-down transistor 306 with the additional driving power of pull-down transistors 338 and 376 until output DOUT propagates through delay circuit 340 to turn off pass transistors 336 and 378. This additional driving power causes DOUT to switch faster than it would otherwise. However, after the delay period is over, the additional driving power is removed by turning off the related pass transistors.

Similarly, when input DIN is high, then DOUT is also high (in the steady state). Accordingly, pass transistors 330 and 372 are on, while pass transistors 336 and 378 are off. When input DIN transitions from high to low, then pass transistors 330 and 372 remain on until the end of the delay period and cause pull-up transistors 334 and 370 to add their driving capability to that of inverting buffers 326 and 366, respectively. Thereby, pull-up driver 304 and 306 are more quickly switched until the end of the delay period when pass transistors 330 and 372 are turned off.

Figure 4:
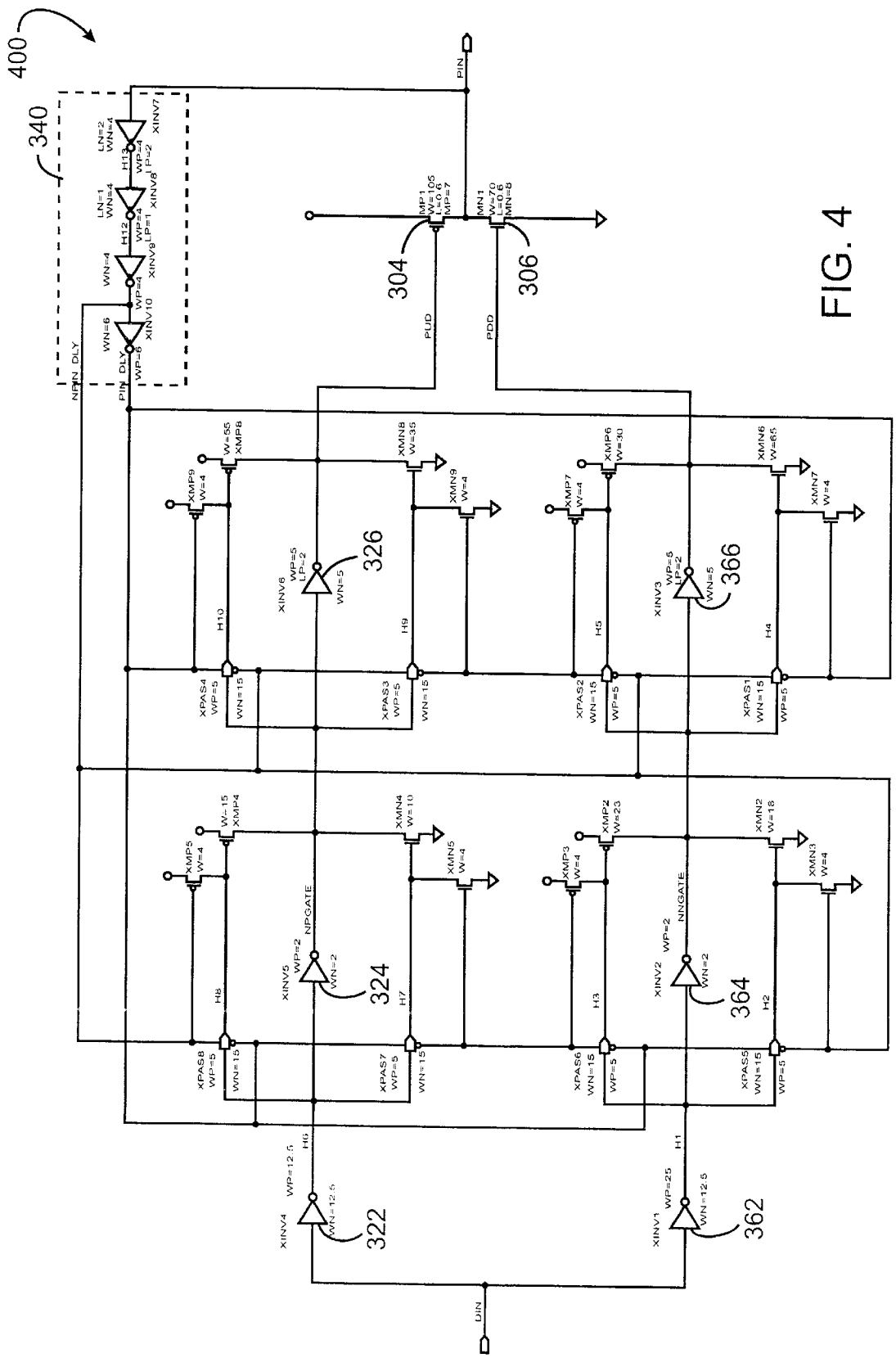
FIG. 4 shows a circuit diagram of a second specific embodiment of an output buffer of the present invention.

FIG. 4 shows another embodiment of an output buffer 400 according to the present invention. Output buffer 400 differs from output buffer 300 in FIG. 3 in that the predriver circuitry is repeated for the output of inverting buffers 324 and 364 making output buffer 300 even faster. Of course, the pass transistors associated with inverting buttons 324 and 364 are coupled to delay circuit 340 in the appropriate polarity as those associated with inverting buffers 326 and 366. In this configuration, during the transition from one logic level to another on DIN, both the second and third inverting buffer stages are enhanced with additional driving power during the delay period caused by delay circuit 340.

Although, two embodiments are specifically described herein, the present invention is not limited to these specific embodiments. Variations may be made to the specific embodiments shown without departing from the spirit and scope of the present invention. For example, the number of stages in the predriver circuitry may be changed to have more or fewer stages, logic polarities may be changed, transistor sizes may be changed, and the amount of delay in the feedback may be different. The invention is intended to be limited only by the metes and bounds of the attached claims.

What is claimed is:

1. An output buffer circuit comprising:
    a pull-up driver coupled between a first potential source and an output node;
    a pull-down driver coupled between the output node and a second potential source;
    a predriver circuit coupled to the pull-up driver and the pull-down driver; and
    a delay circuit coupled to provide a delayed output signal representative of a signal at the output node to the predriver circuit, wherein an input threshold characteristic of the predriver circuit is varied depending on the delayed output signal.

2. The output buffer circuit of claim 1 wherein the predriver circuit is configured to provide a relatively rapid turn-off of the pull-up driver when the delayed output is a logic high.

3. The output buffer circuit of claim 2 wherein the predriver circuit is configured to provide a relatively rapid turn-on of the pull-down driver when the delayed output is a logic high.

4. The output buffer circuit of claim 1 wherein the predriver circuit is configured to provide a relatively rapid turn-off of the pull-down driver when the delayed output is a logic low.

5. The output buffer circuit of claim 4 wherein the predriver circuit is configured to provide a relatively rapid turn-on of the pull-up driver when the delayed output is a logic low.

6. The output buffer circuit of claim 1 wherein the delay circuit comprises a chain of inverters.

7. The output buffer circuit of claim 1 wherein the predriver circuit comprises:
    a first predriver transistor coupled between a third potential source and an input to the pull-up driver;
    a second predriver transistor coupled between the input to the pull-up driver and a fourth potential source; and
    a transmission gate coupled to the delayed output signal to enable coupling of a data signal to the first predriver transistor when the delayed output signal is a logic high.

8. The output buffer circuit of claim I wherein the pre-driver circuit comprises:
    a first predriver transistor coupled between a third potential source and an input to the pull-down driver;
    a second predriver transistor coupled between the input to the pull-down driver and a fourth potential source; and
    a transmission gate coupled to the delayed output signal to enable coupling of a data signal to the second predriver transistor when the delayed output signal is a logic low.

9. An integrated circuit comprising the output buffer of claim 1.

10. A digital system comprising the integrated circuit of claim 9.

11. An output buffer comprising:
    an output driver with an output node;
    a first buffer coupled between an input node and the output driver;
    a first pull-up transistor coupled between a first potential source and the output of the first buffer;
    a first pull-down transistor coupled between a second potential source and the output of the first buffer;
    a delay circuit coupled to provide a delayed output signal from the output node;
    a first switch to selectively couple the input node to the first pull-up transistor when the delayed output is at a first logic level; and
    a second switch to selectively couple the input node to the first pull-down transistor when the delayed output is at the second logic level.

12. The output buffer of claim 11 wherein the output driver comprises:
    a pull-up driver coupled between the first potential source and the output node; and
    a pull-down driver coupled between the output node and a second potential source.

13. The output buffer of claim 11 wherein the first and second switches are pass transistors.

14. The output buffer of claim 11 wherein the pull-up transistor is kept off when the delayed output is at the second logic level and the pull-down transistor is kept off when the delayed output is at the first logic level.

15. The output buffer of claim 11 further comprising:
    a second buffer coupled between the input node and the output driver;

a second pull-up transistor coupled between the first potential source and the output of the second buffer;

a second pull-down transistor coupled between a second potential source and the output of the second buffer;

a third switch to selectively couple the input node to the second pull-up transistor when the delayed output is at the first logic level; and a fourth switch to selectively couple the input node to the second pull-down transistor when the delayed output is at the second logic level.

16. The output buffer of claim 11 further comprising:

a second buffer coupled between the input node and the first buffer;

a second pull-up transistor coupled between the first potential source and the output of the second buffer;

a second pull-down transistor coupled between a second potential source and the output of the second buffer;

a third switch to selectively couple the input node to the second pull-up transistor when the delayed output is at the second logic level; and a fourth switch to selectively couple the input node to the second pull-down transistor when the delayed output is at the first logic level.

17. The output buffer of claim 11 wherein the first buffer is an invertor.

18. An integrated circuit comprising the output buffer of claim 11.

19. An output buffer comprising:

a pull-up driver coupled between a first potential source and an output node; and a pull-down driver coupled between the output node and a second potential source;

a first inverting buffer coupled between an input node and the pull-up driver;

a second inverting buffer coupled between the input node and the second pull-up driver;

a first transistor coupled between a third potential source and the output of the first inverting buffer;

a second transistor coupled between a third potential source and the output of the second inverting buffer;

a third transistor coupled between a fourth potential source and the output of the first inverting buffer;

a fourth transistor coupled between a fourth potential source and the output of the first inverting buffer;

a delay circuit coupled to provide a delayed output signal after a delay period from the output node, the delayed output signal coupling the input node to the first and third transistors when the delayed output signal is at a first logic level, and coupling the input node to the second and third transistors when the delayed output is at a second logic level.

20. The output buffer of claim 19 wherein the input threshold characteristics of at least one of the first and second inverting buffers is changed during the delay period.

21. An output buffer circuit comprising:

an output driver comprising a pull-up driver and pull-down driver, and capable of providing a signal on an output node;

a first predriver circuit coupled to the pull-up driver, and having a first pull-up capability and a first pull-down capability;

a second predriver circuit coupled to the pull-down driver, and having a second pull-up capability and a second pull-down capability; and a delay circuit coupled to the first predriver circuit and the second predriver circuit and capable of providing a delayed output signal representative of the signal at the output node, wherein the delayed output signal varies the first pull-up capability, the second pull-up capability, the first pull-down capability, and the second pull-down capability.

22. The output buffer of claim 21 wherein the first pull-up capability, the second pull-up capability, the first pull-down capability, and the second pull-down capability are varied by enabling and disabling transistors.

23. An output buffer circuit comprising:

an output driver having a first pull-up circuit coupled between a first voltage supply and an output node, and having a first control electrode, and a first pull-down circuit coupled between a second voltage supply and the output node, and having a second control electrode;

a first predriver circuit having a second pull-up circuit coupled between the first supply voltage and the first control electrode, and a second pull-down circuit coupled between the second supply voltage and the first control electrode;

a second predriver circuit having a third pull-up circuit coupled between the first supply voltage and the second control electrode, and a third pull-up circuit coupled between the second supply voltage and the second control electrode; and a delay circuit having an input coupled to the output node, and an output coupled to the second pull-up circuit, the second pull-down circuit, the third pull-up circuit, and the third pull-down circuit, wherein the delay circuit output enables and disables the second pull-up circuit, the second pull-down circuit, the third pull-up circuit, and the third pull-down circuit.

24. The output buffer circuit of claim 23 wherein when the delay circuit output is high, the second pull-up circuit is enabled, the second pull-down circuit is disabled, the third pull-up circuit is enabled, and the third pull-down circuit is disabled.

25. The output buffer circuit of claim 24 wherein when the delay circuit output is low, the second pull-up circuit is disabled, the second pull-down circuit is enabled, the third pull-up circuit is disabled, and the third pull-down circuit is enabled.

26. A method of driving an output node comprising:

providing a pull-up circuit having a first control electrode and coupled to the output node, the output node capable of transitioning between a first voltage state and a second voltage state;

providing a pull-down having a second control electrode and coupled to the output node;

providing a first predriver coupled between an input node and the first control electrode and having a first variable input voltage threshold, the input node capable of transitioning between a third voltage state and a fourth voltage state;

providing a second predriver coupled between the input node and the second control electrode and having a second variable input voltage threshold;

applying a voltage transition from the third voltage state to the fourth voltage state to the input node;

after a period of time, varying the first variable input voltage threshold and the second variable input voltage threshold.

27. The method of claim 26 wherein the first variable input voltage threshold is capable of having a first value and a second value, the second variable input voltage threshold is capable of having a third value and a fourth value, and after the period of time, the first variable input voltage threshold is changed from the first value to the second value, and the second variable input voltage threshold is changed from the third value to the fourth value.

28. The method of claim 26 wherein the period of time is determined by a delay circuit.

29. The method of claim 28 wherein the delay circuit is an inverter chain coupled to the output node, the first predriver, and the second predriver.

* * * * *